US012796186B2

(12) United States Patent
Chen et al.

(10) Patent No.: US 12,796,186 B2
(45) Date of Patent: Nov. 10, 2026

(54) ELECTRONIC DEVICE

(71) Applicant: Innolux Corporation, Miaoli County (TW)

(72) Inventors: Jia-Yuan Chen, Miaoli County (TW); Tsung-Han Tsai, Miaoli County (TW); Kuan-Feng Lee, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 216 days.

(21) Appl. No.: 18/896,928

(22) Filed: Sep. 26, 2024

(65) Prior Publication Data

US 2025/0143037 A1 May 1, 2025

Related U.S. Application Data

(60) Provisional application No. 63/594,037, filed on Oct. 30, 2023.

(30) Foreign Application Priority Data

Jun. 19, 2024 (CN) ........................ 202410795231.X

(51) Int. Cl.

| | |
|---|---|
| ***H10H 20/851*** | (2025.01) |
| ***H10H 20/831*** | (2025.01) |
| ***H10H 20/857*** | (2025.01) |
| ***H10W 90/00*** | (2026.01) |

(52) U.S. Cl.

CPC .... *H10H 20/8514* (2025.01); *H10H 20/8312* (2025.01); *H10H 20/857* (2025.01); *H10W 90/00* (2026.01)

(58) Field of Classification Search

CPC ............. H10H 20/8514; H10H 20/857; H10H 20/8312; H10W 90/00

See application file for complete search history.

(56) References Cited

U.S. PATENT DOCUMENTS

| | | | | |
|---|---|---|---|---|
| 2022/0209157 | A1* | 6/2022 | Lee | H10K 50/19 |
| 2024/0407198 | A1* | 12/2024 | Lim | H10K 59/352 |
| 2025/0221112 | A1* | 7/2025 | Shin | H10H 20/8512 |

FOREIGN PATENT DOCUMENTS

| | | |
|---|---|---|
| CN | 112259533 | 1/2021 |
| CN | 112835219 | 5/2021 |
| CN | 113257851 | 8/2021 |

* cited by examiner

*Primary Examiner* — Anne M Hines
(74) *Attorney, Agent, or Firm* — JCIPRNET

(57) ABSTRACT

An electronic device includes a substrate, a circuit layer, a first light emitting unit, a second light emitting unit, and a light conversion layer. The circuit layer is disposed on the substrate. The first and second light emitting units are disposed on the circuit layer and are respectively electrically connected to the circuit layer. The light conversion layer is disposed on the first and second light emitting units and includes a first light conversion unit overlapping the first light emitting unit and a second light conversion unit overlapping the second light emitting unit. The first and second light conversion units correspond to a first color. In a top view, an area of the first light emitting unit is smaller than an area of the second light emitting unit, and an area of the first light conversion unit is the same as an area of the second light conversion unit.

20 Claims, 15 Drawing Sheets

100

ELECTRONIC DEVICE

CROSS-REFERENCE TO RELATED APPLICATION

This application claims the priority benefit of U.S. provisional application Ser. No. 63/594,037, filed on Oct. 30, 2023 and China application serial no. 202410795231.X, filed on Jun. 19, 2024. The entirety of each of the above-mentioned patent applications is hereby incorporated by reference herein and made a part of this specification.

BACKGROUND

Technical Field

The disclosure relates to an electronic device, and more particularly to an electronic device, which can improve display quality or save manufacturing costs.

Description of Related Art

The electronic device or the spliced electronic device has been widely used in different fields such as communication, display, automotive, or aviation. With the rapid development of the electronic device, the electronic device is being developed toward being lighter and thinner, so the reliability or quality requirement for the electronic device is higher.

SUMMARY

The disclosure provides an electronic device, which can improve display quality or save manufacturing costs.

According to an embodiment of the disclosure, an electronic device includes a substrate, a circuit layer, a first light emitting unit, a second light emitting unit, and a light conversion layer. The circuit layer is disposed on the substrate. The first light emitting unit and the second light emitting unit are disposed on the circuit layer. The first light emitting unit and the second light emitting unit are respectively electrically connected to the circuit layer. The light conversion layer is disposed on the first light emitting unit and the second light emitting unit. The light conversion layer includes a first light conversion unit overlapping the first light emitting unit and a second light conversion unit overlapping the second light emitting unit. The first light conversion unit and the second light conversion unit correspond to a first color. In a top view, an area of the first light emitting unit is smaller than an area of the second light emitting unit, and an area of the first light conversion unit is the same as an area of the second light conversion unit.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DESCRIPTION OF THE EMBODIMENTS

Figure 1:
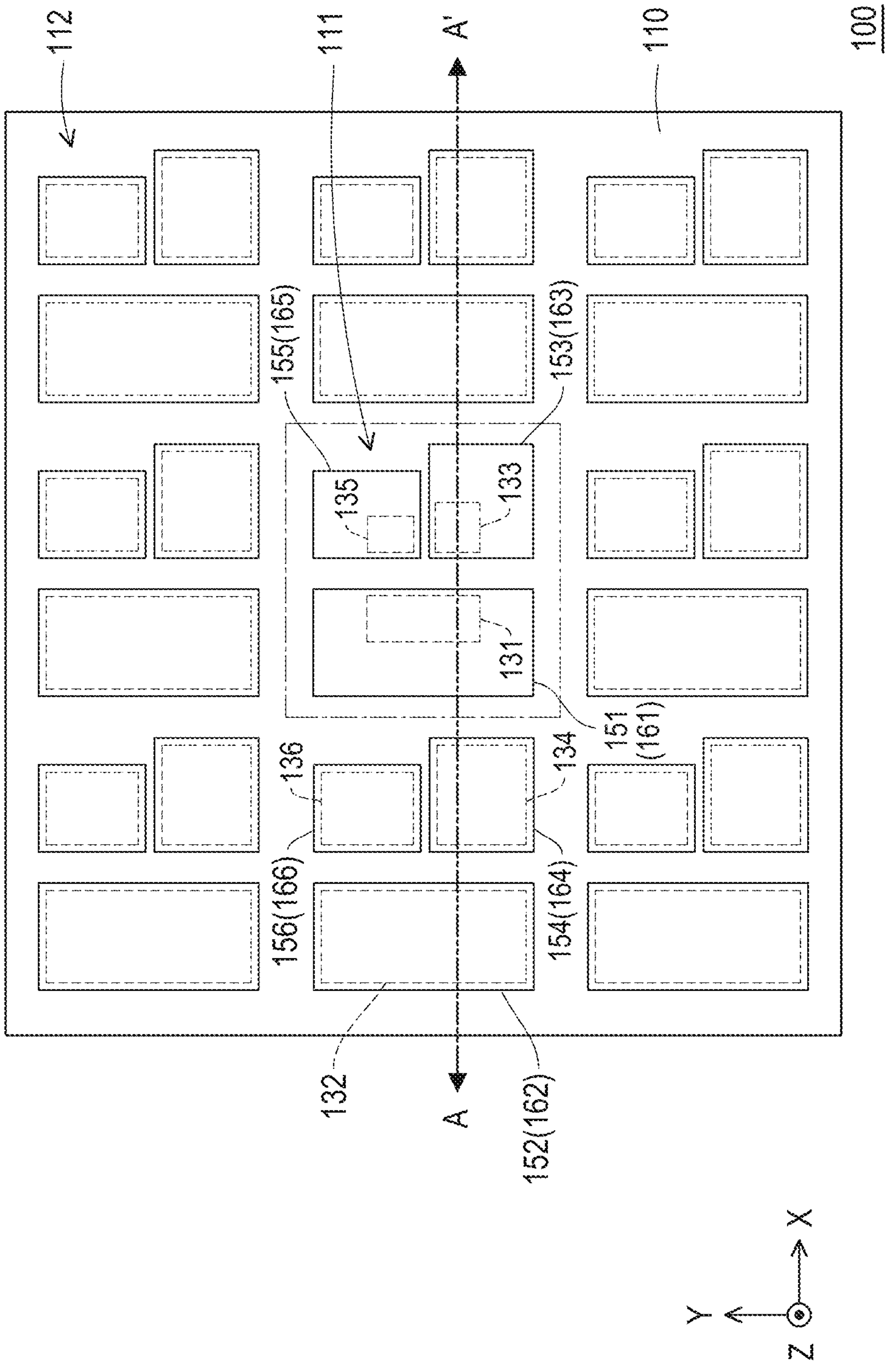
FIG. 1 is a top schematic view of an electronic device according to a first embodiment of the disclosure.

The disclosure can be understood by referring to the following detailed description in conjunction with the drawings. It should be noted that in order to facilitate the understanding of the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

In the following specification and claims, terms such as “containing” and “including” are open-ended terms, so the terms should be interpreted as “containing but not limited to . . . ”.

It should be understood that when an element or a film layer is referred to as being “on” or “connected to” another element or film layer, the element or the film layer may be directly on the other element or film layer or directly connected to the other element or film layer, or there may be an element or a film layer inserted between the two (indirect case). In contrast, when an element is referred to as being “directly on” or “directly connected to” another element or layer, there is no element or film layer inserted between the two.

Although the terms first, second, third . . . may be used to describe various constituent elements, the constituent elements are not limited by the terms. The terms are only used to distinguish a single constituent element from other constituent elements in the specification. The same terms may not be used in the claims, but replaced by first, second, third . . . according to the order in which the elements are declared in the claims. Therefore, in the following specification, a first constituent element may be a second constituent element in the claims.

As used herein, the terms “about”, “approximately”, “substantially”, and “roughly” generally indicate a range within 10%, within 5%, within 3%, within 2%, within 1%, or within 0.5% of a given value. The number given here is an approximate number, that is, in the case where “about”, “approximately”, “substantially”, or “roughly” is not specifically stated, the meanings of “about”, “approximately”, “substantially”, or “roughly” may still be implied.

In some embodiments of the disclosure, terms related to bonding and connection, such as “connection” and “interconnection”, unless otherwise defined, may refer to that two structures are directly in contact or may also refer to that two structures are not directly (indirectly) in contact, wherein there is another structure disposed between the two structures. Also, the terms related to bonding and connection may further include the case where two structures are both movable or two structures are both fixed. Furthermore, the term "coupling" includes any direct or indirect electrical connection means.

In some embodiments of the disclosure, an optical microscope (OM), a scanning electron microscope (SEM), an a-step film thickness profiler, an ellipsometer, or other suitable manners may be used to measure the area, width, thickness, or height of each element or the distance or spacing between elements. In detail, according to some embodiments, a scanning electron microscope may be used to obtain a cross-sectional structural image including an element to be measured and measure the area, width, thickness, or height of each element or the distance or spacing between the elements.

The electronic device of the disclosure may include a display device, an antenna device, a sensing device, or a splicing device, but not limited thereto. The electronic device may be a bendable or flexible electronic device. The electronic device may include, for example, a liquid crystal light emitting diode. The light emitting diode may include, for example, an organic light emitting diode (OLED), a mini LED, a micro LED, or a quantum dot (QD) LED (which may be, for example, QLED or QDLED), fluorescence, phosphor, or other suitable materials, and the materials may be arranged or combined in any manner, but not limited thereto. The antenna device may be, for example, a liquid crystal antenna, but not limited thereto. The splicing device may be, for example, a display splicing device or an antenna splicing device, but not limited thereto. It should be noted that the electronic device may be any arrangement or combination of the above, but not limited thereto. The disclosure will be described below with the electronic device, but the disclosure is not limited thereto.

It should be noted that in the following embodiments, the technical features of several different embodiments may be replaced, reorganized, and mixed to complete other embodiments without departing from the spirit of the disclosure.

Reference will now be made in detail to the exemplary embodiments of the disclosure, and examples of the exemplary embodiments are illustrated in the drawings. Wherever possible, the same reference numerals are used in the drawings and the description to indicate the same or similar parts.

FIG. 1 is a top schematic view of an electronic device according to a first embodiment of the disclosure. FIG. 2A to FIG. 2F are cross-sectional schematic views of a method for manufacturing the electronic device of FIG. 1. FIG. 2F is a cross-sectional schematic view of the electronic device of FIG. 1 along a cross-sectional line A-A'. FIG. 3 is an enlarged schematic view of a region R of FIG. 2A. FIG. 4 is a top schematic view of a method for manufacturing the electronic device of FIG. 2C to FIG. 2D. For the sake of clarity and convenience of description, some elements of an electronic device 100 are omitted in FIG. 1 and FIG. 4.

Please refer to FIG. 1 and FIG. 2F at the same time. The electronic device 100 of the embodiment includes a substrate 110, a circuit layer 120, a light emitting unit layer 130, a light guiding layer 140, a light conversion layer 150, a color filter layer 160, and a cover plate 170.

Specifically, the substrate 110 has a central region 111 and a peripheral region 112, and the peripheral region 112 surrounds the central region 111. In the embodiment, the substrate 110 may include a hard substrate, a soft substrate, or a combination thereof. For example, the material of the substrate 110 may include glass, quartz, sapphire, ceramic, polycarbonate (PC), polyimide (PI), polyethylene terephthalate (PET), other suitable substrate materials, or a combination thereof, but not limited thereto.

The circuit layer 120 is disposed on the substrate 110. The circuit layer 120 at least includes a first electrode 1211, a second electrode 1212, a third electrode 1213, a fourth electrode 1214, a fifth electrode 1215, and a wiring stack 129 connected to the electrodes. In a direction Z, the first electrode 1211 and the third electrode 1213 are disposed corresponding to the central region 111 of the substrate 110, and the second electrode 1212 and the fourth electrode 1214 are disposed corresponding to the peripheral region 112 of the substrate 110. In addition, the first electrode 1211 may correspond to a first light emitting unit 131, the second electrode 1212 may correspond to a second light emitting unit 132, the third electrode 1213 may correspond to a third light emitting unit 133, and the fourth electrode 1214 may correspond to a fourth light emitting unit 134.

In the embodiment, a direction X, a direction Y, and the direction Z are different directions. For example, the direction X is, for example, an extension direction of the cross-sectional line A-A', and the direction Z is, for example, a normal direction of the substrate 110 or a normal direction of the electronic device 100. The direction X is roughly perpendicular to the direction Z, and the direction X and the direction Z are respectively roughly perpendicular to the direction Y, but not limited thereto.

The light emitting unit layer 130 includes the first light emitting unit 131, the second light emitting unit 132, the third light emitting unit 133, the fourth light emitting unit 134, a fifth light emitting unit 135, a sixth light emitting unit 136, and a black matrix layer 137. The first light emitting unit 131, the second light emitting unit 132, the third light emitting unit 133, the fourth light emitting unit 134, the fifth light emitting unit 135, and the sixth light emitting unit 136 are respectively disposed on the circuit layer 120. The first light emitting unit 131, the second light emitting unit 132, the third light emitting unit 133, the fourth light emitting unit 134, the fifth light emitting unit 135, and the sixth light emitting unit 136 may emit light of the same color. The black matrix layer 137 is disposed between two adjacent light emitting units.

In the cross-sectional view (as shown in FIG. 2F), the light emitting units (that is, the first light emitting unit 131, the second light emitting unit 132, the third light emitting unit 133, and the fourth light emitting unit 134) may each include a stack unit U1, a second semiconductor layer SL2, a buffer layer BL1, an electrode E1, and an electrode E2. The stack unit U1 includes a first semiconductor layer SL1 and a light emitting material layer FL. The first semiconductor layer SL1 is located between the light emitting material layer FL and the circuit layer 120. The light emitting material layer FL is located between the second semiconductor layer SL2 and the first semiconductor layer SL1, and the light emitting material layer FL may be electrically connected to the circuit layer 120 through the first semiconductor layer SL1. The second semiconductor layer SL2 is disposed on the stack unit U1. The buffer layer BL1 is disposed under the stack unit U1. The first semiconductor layer SL1 is located between the light emitting material layer FL and the buffer layer BL1. The buffer layer BL1 has a rough surface to reduce the total reflection of light rays inside the stack unit U1 to improve the light output. The electrode E1 is disposed between the stack unit U1 and the circuit layer 120, and the electrode E1 may electrically connect the first semiconductor layer SL1 and the circuit layer 120. The electrode E2 is disposed between the second semiconductor layer SL2 and the circuit layer 120, and the electrode E2 may electrically connect the second semiconductor layer SL2 and the circuit layer 120. The light emitting units (that is, the first light emitting unit 131, the second light emitting unit 132, the third light emitting unit 133, the fourth light emitting unit 134, the fifth light emitting unit 135, and the sixth light emitting unit 136) may be electrically connected to the corresponding electrodes (that is, the first electrode 1211, the second electrode 1212, the third electrode 1213, the fourth electrode 1214, and the fifth electrode 1215) in the circuit layer 120 through the electrodes (that is, the electrodes E1 and the electrodes E2) and a conductive member C1. In addition, in the embodiment, the first semiconductor layer SL1 may be a P-type semiconductor, and the second semiconductor layer SL2 may be an N-type semiconductor. At this time, the first electrode 1211, the second electrode 1212, the third electrode 1213, and the fourth electrode 1214 are anodes, and the fifth electrode 1215 is a cathode. In some other embodiments, the first semiconductor layer SL1 may be an N-type semiconductor, and the second semiconductor layer SL2 may be a P-type semiconductor. At this time, the first electrode 1211, the second electrode 1212, the third electrode 1213, and the fourth electrode 1214 are cathodes, and the fifth electrode 1215 is an anode.

In the embodiment, in direction Z, the first light emitting unit 131, the third light emitting unit 133, and the fifth light emitting unit 135 may overlap and correspond to the central region 111 of the substrate 110, and the second light emitting unit 132, the fourth light emitting unit 134, and the sixth light emitting unit 136 may overlap and correspond to the peripheral region 112 of the substrate 110. In the cross-sectional view (as shown in FIG. 2F), a width W1 of the stack unit U1 of the first light emitting unit 131 may be smaller than a width W2 of the stack unit U1 of the second light emitting unit 132, and a width W3 of the stack unit U1 of the third light emitting unit 133 may be smaller than a width W4 of the stack unit U1 of the fourth light emitting unit 134. The width W1, the width W2, the width W3 and the width W4 are respectively the maximum widths of the stack units U1 in the first light emitting unit 131, the second light emitting unit 132, the third light emitting unit 133, and the fourth light emitting unit 134 measured along the direction X.

In the top view (as shown in FIG. 1), the area of the third light emitting unit 133 is different from the area of the first light emitting unit 131, and the area of the fifth light emitting unit 135 is different from the area of the first light emitting unit 131 and the area of the third light emitting unit 133. For example, in the top view (as shown in FIG. 1), the area of the first light emitting unit 131 may be smaller than the area of the second light emitting unit 132, the area of the third light emitting unit 133 may be smaller than the area of the fourth light emitting unit 134, and the area of the fifth light emitting unit 135 may be smaller than the area of the sixth light emitting unit 136. More specifically, in the disclosure, the sum of the areas of the stack units U1 of a light emitting unit in the top view may represent the area of the light emitting unit, and in the embodiment, since the number of the stack unit U1 in each light emitting unit is 1, a larger area of the stack unit U1 indicates a larger area of the corresponding light emitting unit, and a smaller area of the stack unit U1 indicates a smaller area of the corresponding light emitting unit. For example, since the area of the stack unit U1 in the first light emitting unit 131 may also be smaller than the area of the stack unit U1 in the second light emitting unit 132, it represents that the area of the first light emitting unit 131 may be smaller than the area of the second light emitting unit 132.

Generally, during the process of manufacturing light emitting units, the epitaxial effect and the light emitting efficiency of the light emitting units in the central region are higher than those of the light emitting units in the peripheral region due to different positions of forming an epitaxial structure. Therefore, in the electronic device 100 of the embodiment, through enabling the areas of the light emitting units in the central region 111 (that is, the first light emitting unit 131, the third light emitting unit 133, and the fifth light emitting unit 135) to be smaller than the areas of the corresponding light emitting units in the peripheral region 112 (that is, the second light emitting unit 132, the fourth light emitting unit 134, and the sixth light emitting unit 136), the light emissions of the light emitting units in the central region 111 may be roughly the same as the light emissions of the light emitting units in the peripheral region 112, thereby improving the display quality.

As shown in FIG. 2F, the light guiding layer 140 is disposed between the light conversion layer 150 and the first light emitting unit 131 (or the light emitting unit layer 130) to improve brightness. The light guiding layer 140 may be disposed overlapping and corresponding to the black matrix layer 137 in the light emitting unit layer 130 in the direction Z. In other words, the light guiding layer 140 includes openings 141 and a spacer 142 located between the openings 141. The openings 141 may overlap and correspond to the stack units U1 of the light emitting units (that is, the first light emitting unit 131, the second light emitting unit 132, the third light emitting unit 133, and the fourth light emitting unit 134) in the direction Z, and the spacer 142 between the openings 141 may overlap with the black matrix layer 137. A width W5 of a bottom part of the opening 141 adjacent to the stack unit U1 may be roughly the same as the width of the stack unit U1, and a width W6 of a top part of the opening 141 away from the stack unit U1 may be roughly the same as a width W7 of a surface of a light conversion unit adjacent to the light guiding layer 140 in the light conversion layer 150. The width W5, the width W6, and the width W7 are respectively the maximum widths of the bottom part of the opening 141, the top part of the opening 141, and the surface of the light conversion unit adjacent to the light guiding layer 140 measured along the direction X. The light output direction of the light emitting unit may be adjusted through the appearance of the spacer 142 to improve the light output brightness of the electronic device 100.

Please refer to FIG. 1 and FIG. 2F at the same time. The light conversion layer 150 is disposed on the light emitting unit layer 130 and the light guiding layer 140. The light conversion layer 150 is disposed on the first light emitting unit 131 and the second light emitting unit 132. The light conversion layer 150 includes a first light conversion unit 151 overlapping and corresponding to the first light emitting unit 131, a second light conversion unit 152 overlapping and corresponding to the second light emitting unit 132, a third light conversion unit 153 overlapping and corresponding to the third light emitting unit 133, a fourth light conversion unit 154 overlapping and corresponding to the fourth light emitting unit 134, a fifth light conversion unit 155 overlapping and corresponding to the fifth light emitting unit 135, a sixth light conversion unit 156 overlapping and corresponding to the sixth light emitting unit 136, and a black matrix layer 157 overlapping and corresponding to the spacer 142 of the light guiding layer 140. The first light conversion unit 151 and the second light conversion unit 152 correspond to a first color (for example, green, but not limited thereto), the third light conversion unit 153 and the fourth light conversion unit 154 correspond to a second color (for example, red, but not limited thereto), and the fifth light conversion unit 155 and the sixth light conversion unit 156 correspond to a third color (for example, blue, but not limited thereto). In the cross-sectional view (as shown in FIG. 2F), a width W8 of a surface of the first light conversion unit 151 away from the light guiding layer 140 is roughly equal to a width W8 of a surface of the second light conversion unit 152 away from the light guiding layer 140, and a width W9 of a surface of the third light conversion unit 153 away from the light guiding layer 140 is roughly equal to a width W9 of a surface of the fourth light conversion unit 154 away from the light guiding layer 140. The width W8 and the width W9 are respectively the maximum widths of the surface of the first light conversion unit 151 (or the second light conversion unit 152) away from the light guiding layer 140 and the surface of the third light conversion unit 153 (or the fourth light conversion unit 154) away from the light guiding layer 140 measured along the direction X. It should be noted that the description of "two optical layers corresponding to the same color" in the disclosure does not represent that light rays emitted from the two optical layers have exactly the same spectrum distribution, but rather represents that when a user observes the light rays emitted from the two optical layers, the user believes that the colors of the two light rays are not much different and are basically the same color.

In the top view (as shown in FIG. 1), the area of the first light conversion unit 151 is the same as the area of the second light conversion unit 152, the area of the third light conversion unit 153 is the same as the area of the fourth light conversion unit 154, and the area of the fifth light conversion unit 155 is the same as the area of the sixth light conversion unit 156. In the top view (as shown in FIG. 1), the area of the third light conversion unit 153 may be different from the area of the first light conversion unit 151, and the area of the fifth light conversion unit 155 may be different from the area of the first light conversion unit 151 and the area of the third light conversion unit 153. In the embodiment, in the top view (as shown in FIG. 1), the area of the first light conversion unit 151 may be larger than the area of the third light conversion unit 153, and the area of the third light conversion unit 153 may be larger than the area of the fifth light conversion unit 155, but not limited thereto. In the embodiment, in the top view (as shown in FIG. 1), the area of the light conversion unit may be larger than the area of the corresponding light emitting unit. For example, the area of the first light conversion unit 151 may be larger than the area of the first light emitting unit 131, the area of the third light conversion unit 153 may be larger than the area of the third light emitting unit 133, and the area of the fifth light conversion unit 155 may be larger than the area of the fifth light emitting unit 135, but not limited thereto.

The color filter layer 160 is disposed on the light conversion layer 150. The color filter layer 160 includes a first filter unit 161, a second filter unit 162, a third filter unit 163, a fourth filter unit 164, a fifth filter unit 165, a sixth filter unit 166, and a black matrix layer 167. In the direction Z, the first filter unit 161 overlaps the first light conversion unit 151, the second filter unit 162 overlaps the second light conversion unit 152, the third filter unit 163 overlaps the third light conversion unit 153, the fourth filter unit 164 overlaps the fourth light conversion unit 154, the fifth filter unit 165 overlaps the fifth light conversion unit 155, the sixth filter unit 166 overlaps the sixth light conversion unit 156, and the black matrix layer 167 overlaps the black matrix layer 157. The first filter unit 161 and the second filter unit 162 correspond to the first color, the third filter unit 163 and the fourth filter unit 164 correspond to the second color, and the fifth filter unit 165 and the sixth filter unit 166 correspond to the third color. In the cross-sectional view (as shown in FIG. 2F), a width W10 of a surface of the first filter unit 161 away from the light conversion layer 150 is roughly equal to a width W10 of a surface of the second filter unit 162 away from the light conversion layer 150, and a width W11 of a surface of the third filter unit 163 away from the light conversion layer 150 is roughly equal to a width W11 of a surface of the fourth filter unit 164 away from the light conversion layer 150. The width W10 and the width W11 are respectively the maximum widths of the surface of the first filter unit 161 (or the second filter unit 162) away from the light conversion layer 150 and the surface of the third filter unit 163 (or the fourth filter unit 164) away from the light conversion layer 150 measured along the direction X.

In the top view (as shown in FIG. 1), the area of the first filter unit 161 may be the same as the area of the second filter unit 162, the area of the third filter unit 163 may be the same as the area of the fourth filter unit 164, and the area of the fifth filter unit 165 may be the same as the area of the sixth filter unit 166. In the top view (as shown in FIG. 1), the area of the third filter unit 163 may be different from the area of the first filter unit 161, and the area of the fifth filter unit 165 may be different from the area of the first filter unit 161 and the area of the third filter unit 163.

In the embodiment, light emitted by the light emitting units (that is, the first light emitting unit 131, the second light emitting unit 132, the third light emitting unit 133, the fourth light emitting unit 134, the fifth light emitting unit 135, and the sixth light emitting unit 136) may correspond to the third color (for example, blue, but not limited thereto), and the third color is different from the first color and the second color. In the embodiment, the first light conversion unit 151 and the second light conversion unit 152 may respectively convert the light corresponding to the third color emitted by the first light emitting unit 131 and the second light emitting unit 132 into light corresponding to the first color. Similarly, the third light conversion unit 153 and the fourth light conversion unit 154 may respectively convert the light corresponding to the third color emitted by the third light emitting unit 133 and the fourth light emitting unit 134 into light corresponding to the second color.

In some other embodiments, the light emitted by the first light emitting unit 131 and the second light emitting unit 132 may correspond to the first color (for example, green, but not limited thereto), and the light emitted by the third light emitting unit 133 and the fourth light emitting unit 134 may correspond to the second color (for example, red, but not limited thereto). The use of the light conversion unit and/or the light filter unit is to increase the color purity of light rays.

The cover plate 170 is disposed on the color filter layer 160. In other words, the circuit layer 120, the light emitting unit layer 130, the light guiding layer 140, the light conversion layer 150, and the color filter layer 160 may be disposed between the cover plate 170 and the substrate 110.

In the embodiment, the electronic device 100 further includes an insulation layer IL1, an adhesive layer AD1, an adhesive layer AD2, an insulation layer IL2, and an insulation layer IL3. The insulation layer IL1 is disposed on the substrate 110, the insulation layer IL1 may cover the circuit layer 120 and the light guiding layer 140, and the insulation layer IL1 may surround the light emitting unit layer 130. The adhesive layer AD1 is disposed between the light guiding layer 140 and the light emitting unit layer 130. The insulation layer IL2 covers and surrounds the light conversion layer 150. The adhesive layer AD2 is disposed between the insulation layer IL2 and the insulation layer IL1. The insulation layer IL3 is disposed between the color filter layer 160 and the light conversion layer 150.

Then, please refer to FIG. 2A to FIG. 2F, FIG. 3, and FIG. 4 at the same time. The method for manufacturing the electronic device 100 of the embodiment will be described below.

Figure 2A:
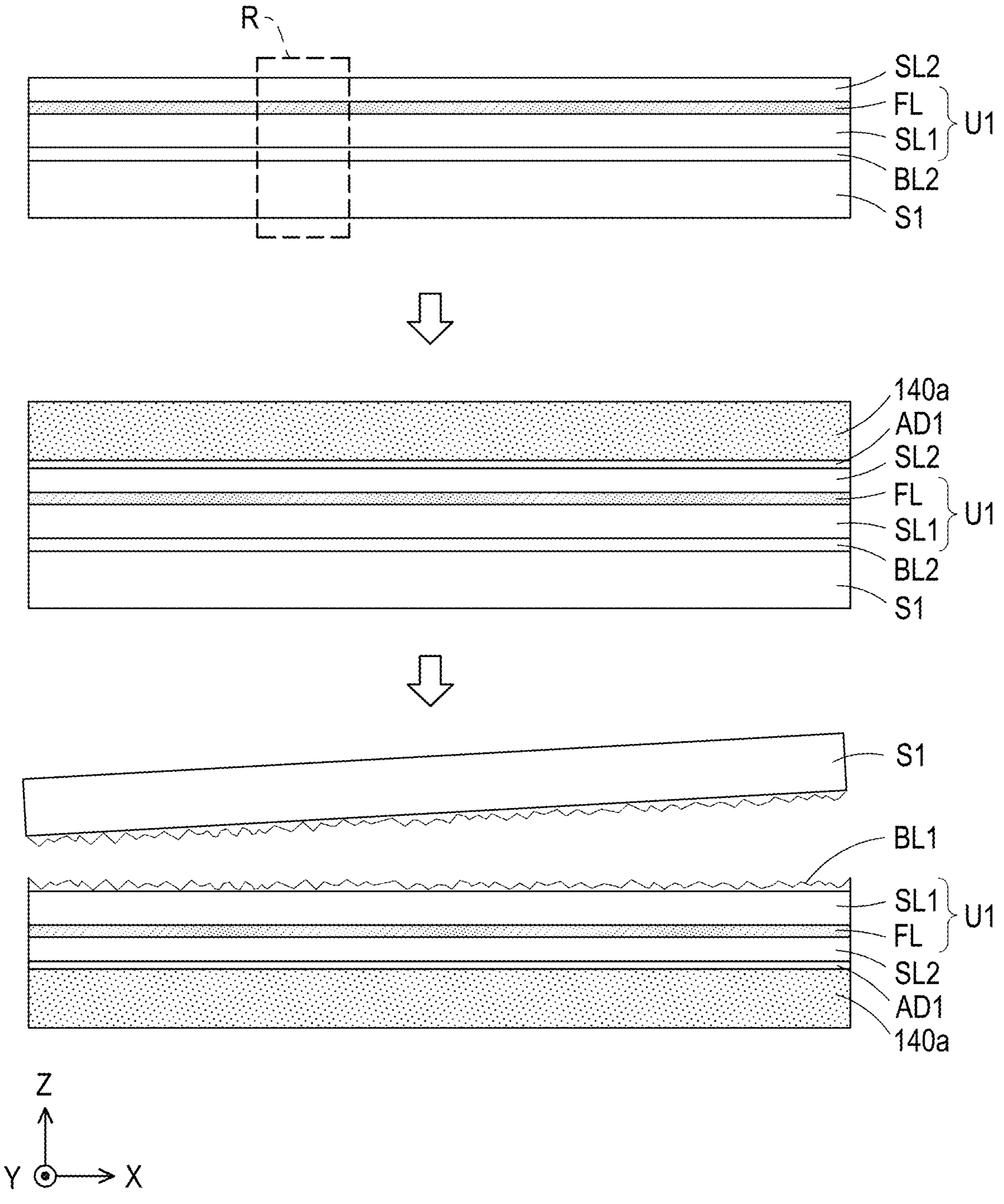
FIG. 2A to FIG. 2F are cross-sectional schematic views of a method for manufacturing the electronic device of FIG. 1.
Figure 3:
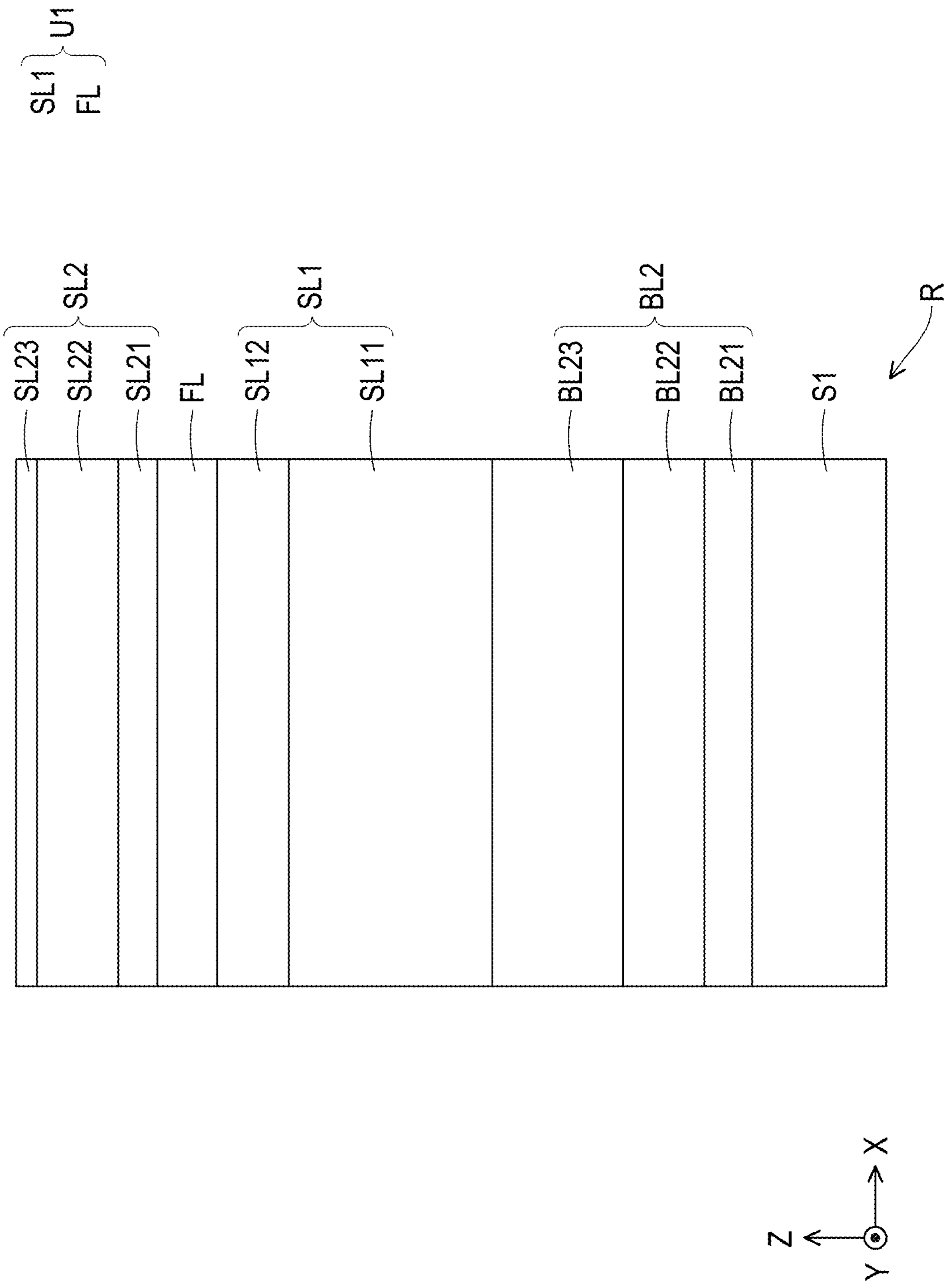
FIG. 3 is an enlarged schematic view of a region R of FIG. 2A.
Figure 4:
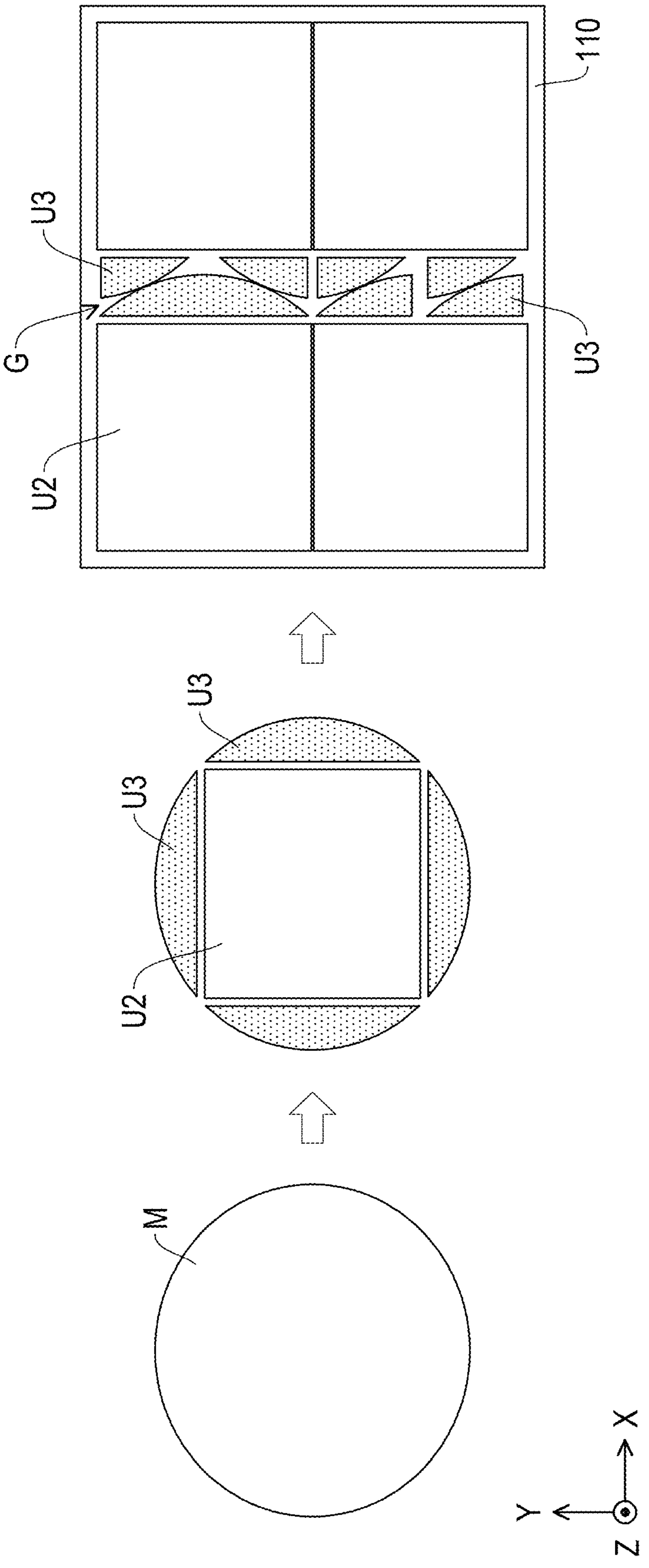
FIG. 4 is a top schematic view of a method for manufacturing the electronic device of FIG. 2C to FIG. 2D.

First, please refer to FIG. 2A and FIG. 3. A buffer material layer BL2 and an epitaxial structure are sequentially formed on a substrate S1. The epitaxial structure includes the stack unit U1 and the second semiconductor layer SL2, and the stack unit U1 includes the first semiconductor layer SL1 and the light emitting material layer FL. The substrate S1 and the buffer material layer BL2 may include recycled materials to reduce costs. For example, the substrate S1 may be a recycled silicon wafer. The buffer material layer BL2 may include a first layer BL21, a second layer BL22, and a third layer BL23, wherein the second layer BL22 is located between the third layer BL23 and the first layer BL21, and the second layer BL22 is further away from the epitaxial structure than the third layer BL23. The material of the first layer BL21 may be aluminum nitride (AlN), the material of the second layer BL22 may be a recycled gallium precursor (such as including aluminum gallium nitride (AlGaN) and impurities), and the material of the third layer BL23 may be gallium nitride (GaN). In some embodiments, if the buffer material layer BL2 further includes a fourth layer (not shown) located between the third layer BL23 and the first layer BL21, the material of the fourth layer may include a recycled gallium precursor (such as including aluminum gallium nitride and impurities). The first semiconductor layer SL1 may include a first layer SL11 and a second layer SL12. The material of the first layer SL11 may be N-type gallium nitride (n-GaN), and the material of the second layer SL12 may be indium gallium nitride (InGaN)/gallium nitride. The material of the light emitting material layer FL may be indium gallium nitride (InGaN)/gallium nitride. The second semiconductor layer SL2 may include a first layer SL21, a second layer SL22, and a third layer SL23, the material of the first layer SL21 may be P-type aluminum gallium nitride (p-AlGaN), the material of the second layer SL22 may be P-type gallium nitride (p-GaN), and the material of the third layer SL23 may be P-type gallium nitride.

Next, please continue to refer to FIG. 2A, the adhesive layer AD1 is formed on the second semiconductor layer SL2, and the adhesive layer AD1 is used to bond a light guiding material layer 140*a* onto the second semiconductor layer SL2 of the epitaxial structure.

Next, please continue to refer to FIG. 2A. After flipping upside down, the substrate S1 and a part of the buffer material layer BL2 are removed by, for example, a peeling manner to form the buffer layer BL1 having a rough surface on the first semiconductor layer SL1.

Figure 2B:
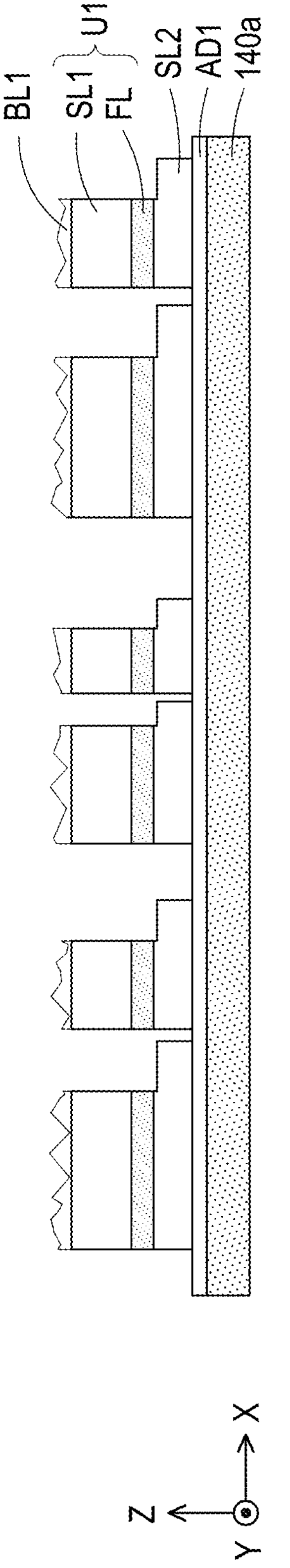

Next, please refer to FIG. 2B. The buffer layer BL1 is patterned by, for example, etching, and the first semiconductor layer SL1, the light emitting material layer FL, and the second semiconductor layer SL2 are etched by, for example, a platform process (mesa) to expose a part of the first semiconductor layer SL1, a part of the second semiconductor layer SL2, and a part of the adhesive layer AD1.

Figure 2C:
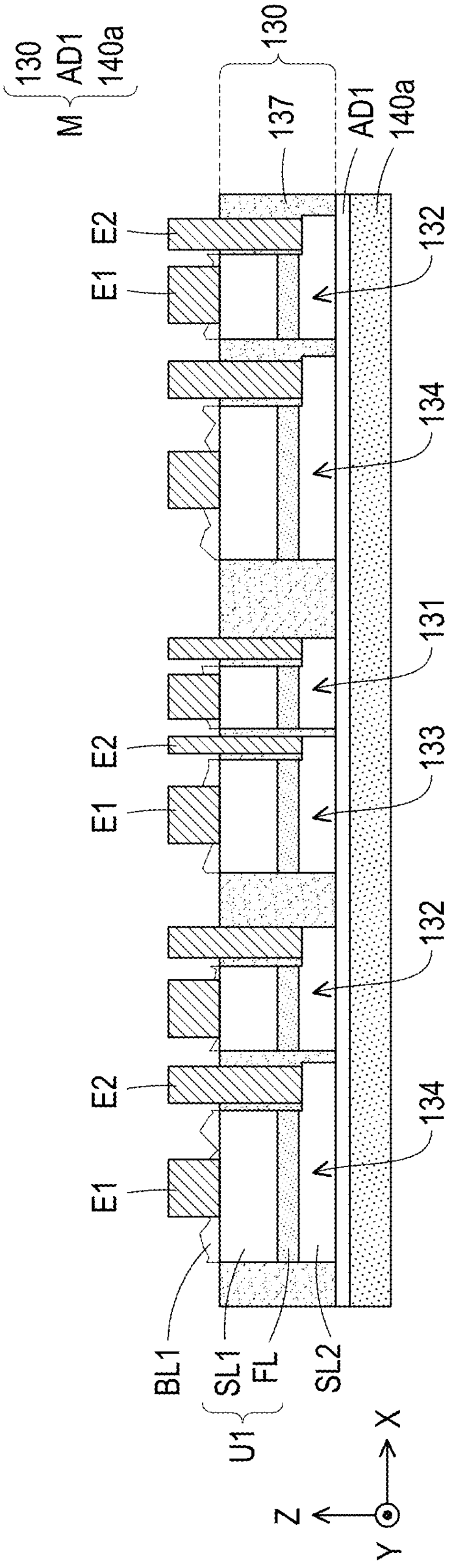

Next, please refer to FIG. 2C. The electrode E1 is formed on the exposed part of the first semiconductor layer SL1, and the electrode E2 is formed on the exposed part of the second semiconductor layer SL2 to form the first light emitting unit 131, the second light emitting unit 132, the third light emitting unit 133, and the fourth light emitting unit 134.

Next, please continue to refer to FIG. 2C. The black matrix layer 137 is formed between two adjacent light emitting units and between the electrode E2 and the stack unit U1 to roughly form the light emitting unit layer 130.

Figure 2D:
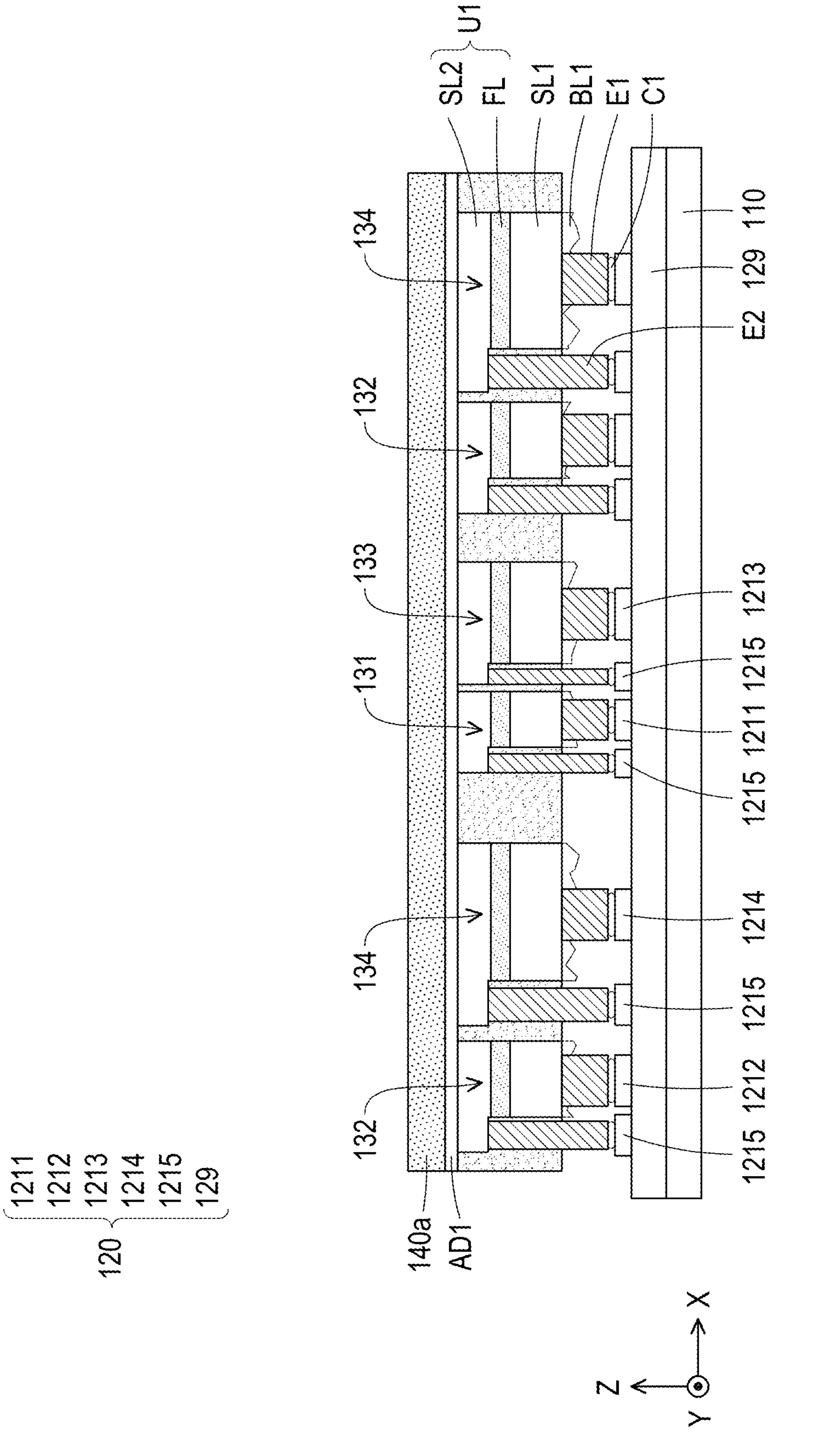

Next, please refer to FIG. 2D and FIG. 4. A patterned stack structure M (including the light guiding material layer 140*a*, the adhesive layer AD1, and the light emitting unit layer 130) of FIG. 2C is cut to form a rectangular splicing unit U2 and a remaining portion U3 of any shape.

Next, please continue to refer to FIG. 2D and FIG. 4. The splicing unit U2 is spliced onto the substrate 110, so that the first light emitting unit 131, the second light emitting unit 132, the third light emitting unit 133, and the fourth light emitting unit 134 may be respectively bonded to the corresponding electrodes in the circuit layer 120 through the conductive member C1. In the embodiment shown in FIG. 4, the remaining portion U3 may be cut and then attached to a gap G between two adjacent splicing units U2 on the substrate 110 (or the gap G exposed by the splicing unit U2 on the substrate 110) to improve the utilization rate of the patterned stack structure M to save costs.

Figure 2E:
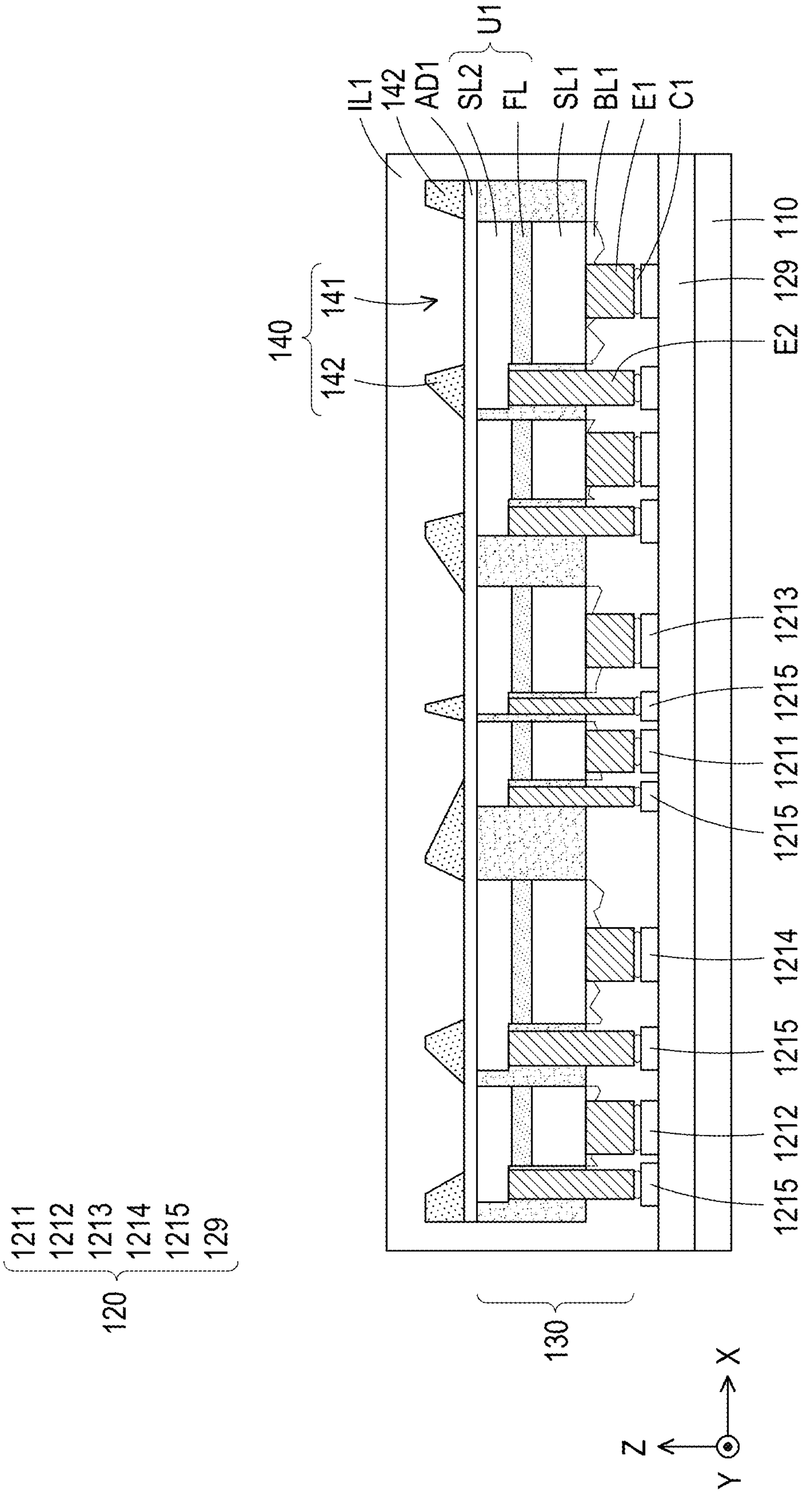
Figure 2F:
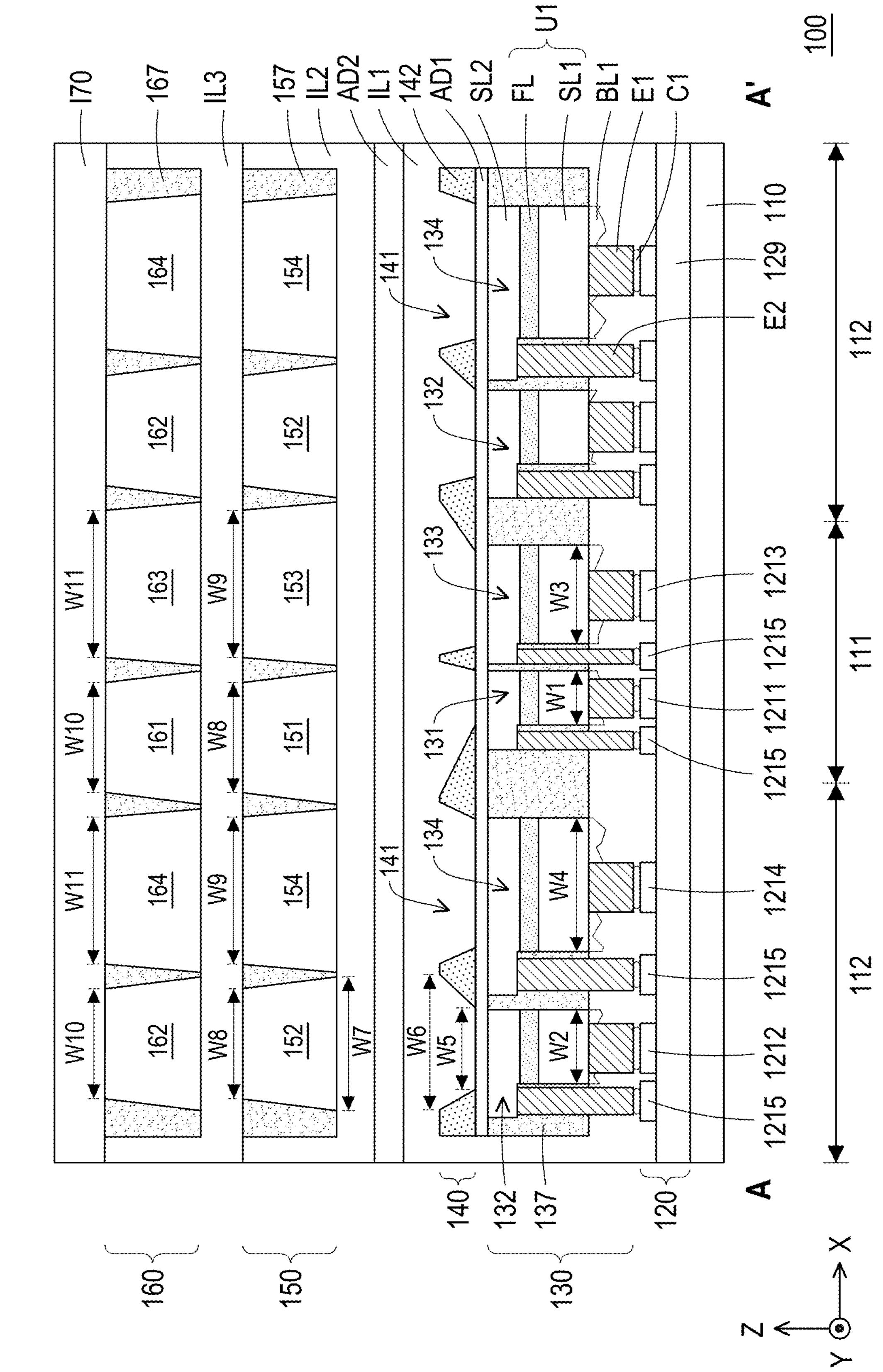

Next, please refer to FIG. 2E. The light guiding material layer 140*a* is patterned by, for example, etching to form the opening 141 and the spacer 142 of the light guiding layer 140. Next, the insulation layer IL1 is formed on the substrate 110, so that the insulation layer IL1 may cover the circuit layer 120 and the light guiding layer 140, and the insulation layer IL1 may surround the light emitting unit layer 130. In some embodiments, before patterning the light guiding material layer 140*a*, the light guiding material layer 140*a* may be thinned by, for example, grinding, depending on design requirements.

Next, please refer to FIG. 2F. An optical substrate is provided, and the optical substrate is assembled onto the substrate 110 through the adhesive layer AD2, so that the light emitting unit layer 130 is located between the optical substrate and the substrate 110. The optical substrate includes the light conversion layer 150, the color filter layer 160, the cover plate 170, the insulation layer IL2, and the insulation layer IL3. The color filter layer 160 is disposed under the cover plate 170, the light conversion layer 150 is disposed under the color filter layer 160, the insulation layer IL2 is disposed under the light conversion layer 150 and surrounds the light conversion layer 150, and the insulation layer IL3 is disposed between the color filter layer 160 and the light conversion layer 150. In some embodiments, the color filter layer 160 may be omitted depending on design requirements.

Other embodiments are listed below for illustration. It must be noted here that the following embodiments continue to use the reference numerals and some content of the foregoing embodiment, wherein the same numerals are adopted to indicate the same or similar elements, and the description of the same technical content is omitted. For the description of the omitted part, reference may be made to the foregoing embodiment, which will not be repeated in the following embodiments.

Figure 5:
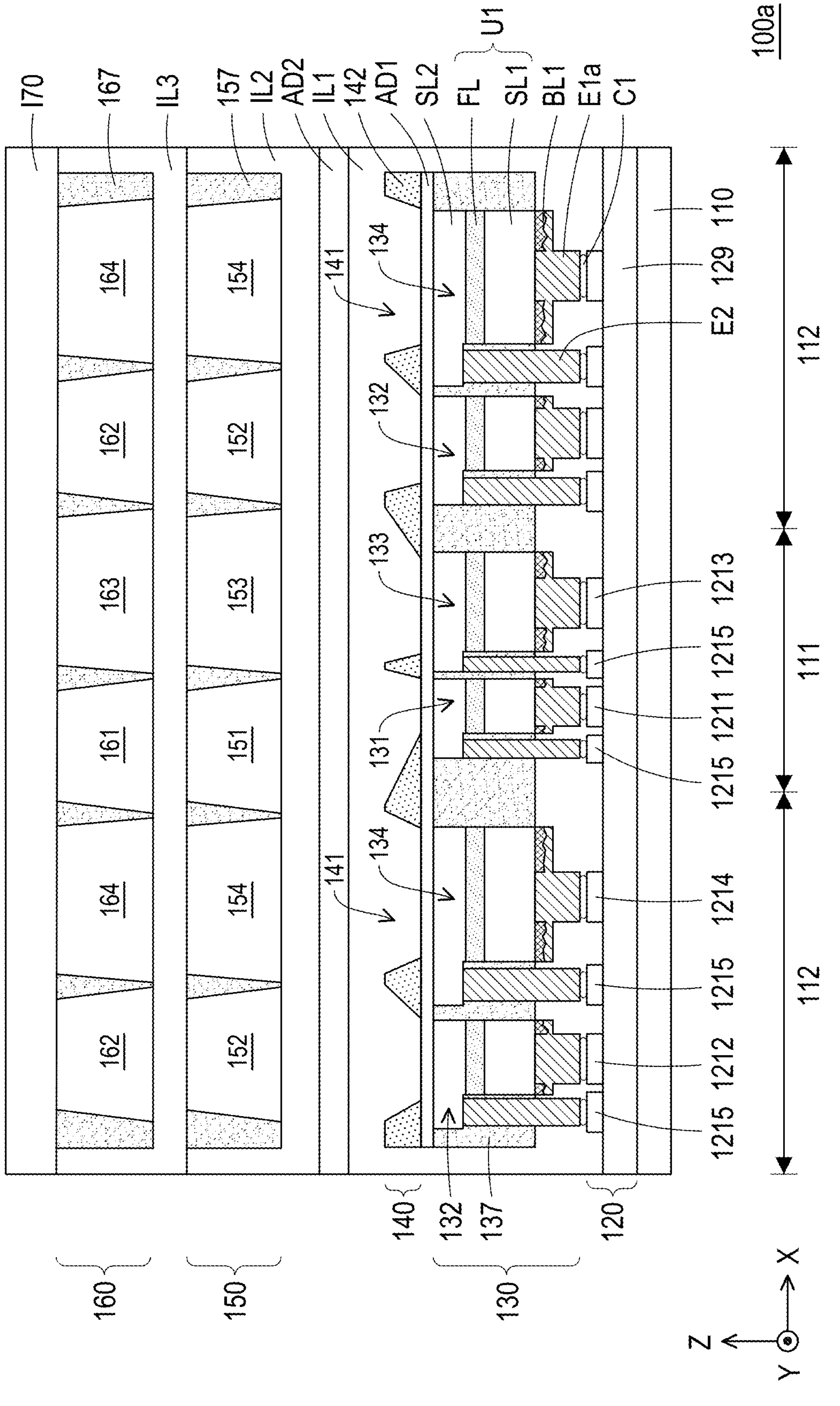
FIG. 5 is a cross-sectional schematic view of an electronic device according to a second embodiment of the disclosure.

FIG. 5 is a cross-sectional schematic view of an electronic device according to a second embodiment of the disclosure. Please refer to FIG. 5 and FIG. 2F at the same time. An electronic device 100*a* of the embodiment is similar to the electronic device 100 of FIG. 2F, but the difference between the two is that in the electronic device 100*a* of the embodiment, an electrode E1*a* may cover the buffer layer BL1. The electrode E1*a* can improve the light emitting efficiency through reflecting the light emitted by the light emitting units (for example, the first light emitting unit 131, the second light emitting unit 132, the third light emitting unit 133, and the fourth light emitting unit 134). In the embodiment, the electrode E1*a* may be manufactured by, for example, a half tone mask, but not limited thereto.

Figure 6:
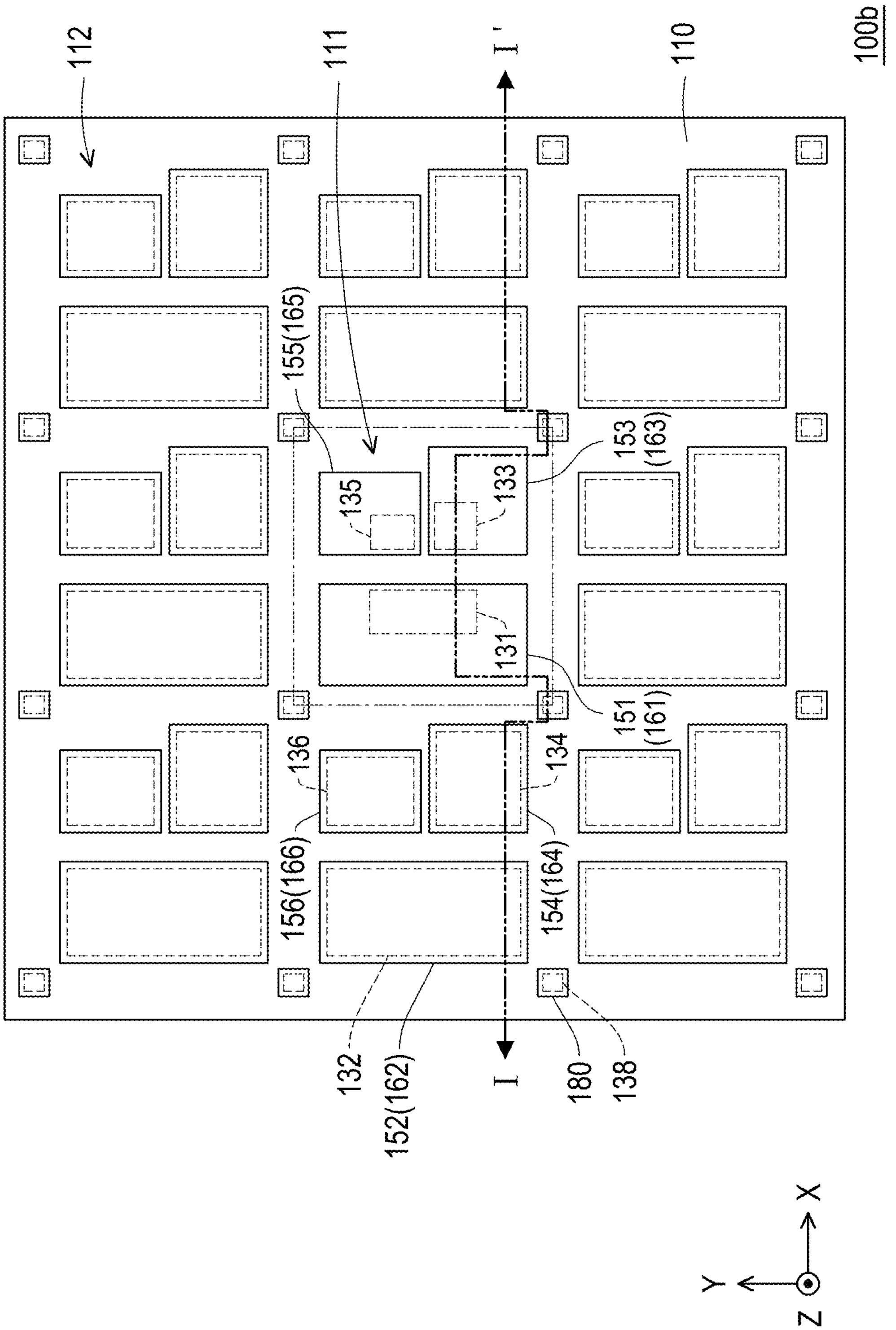
FIG. 6 is a top schematic view of an electronic device according to a third embodiment of the disclosure.
Figure 7:
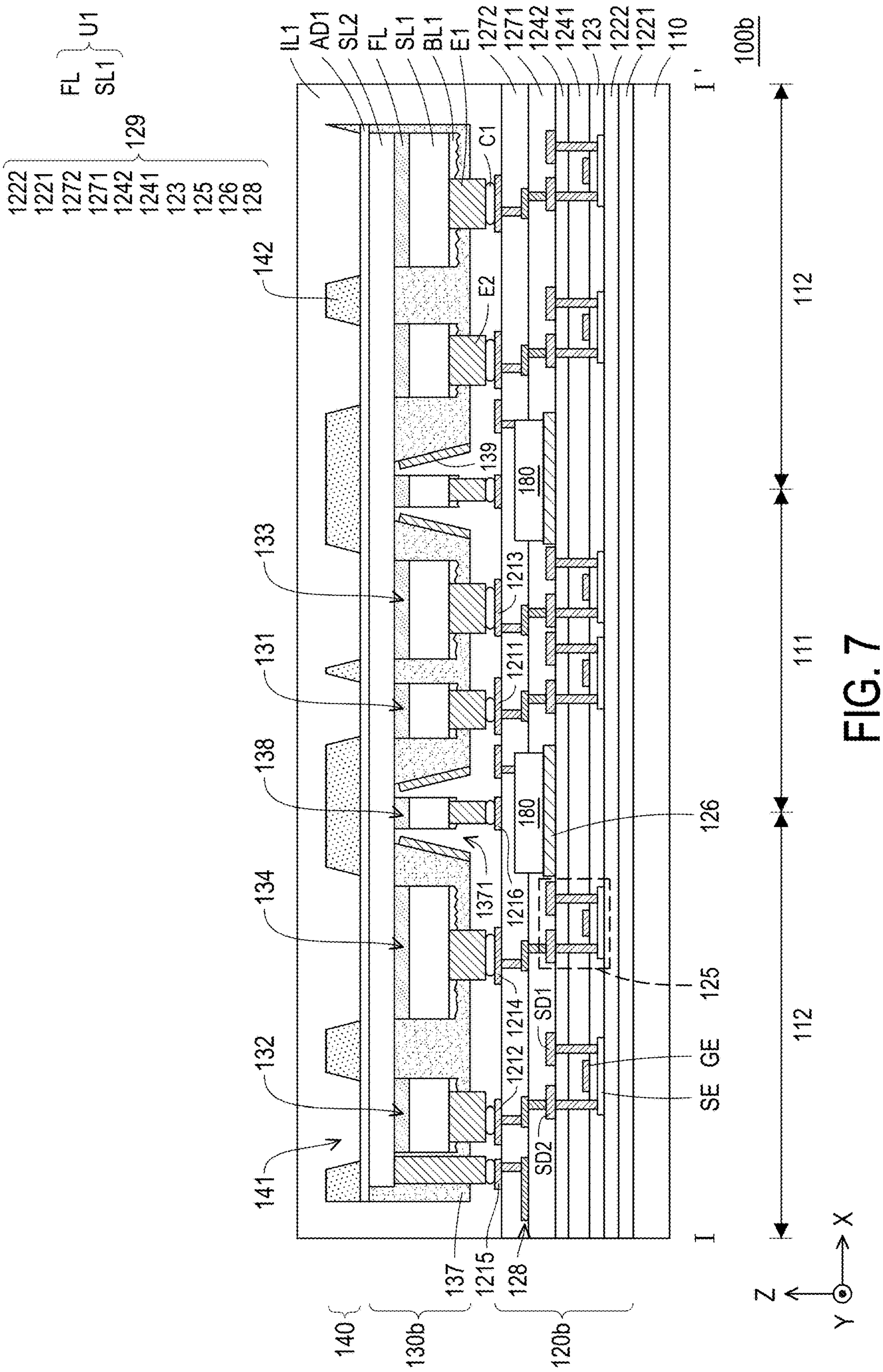
FIG. 7 is a cross-sectional schematic view of the electronic device of FIG. 6 along a cross-sectional line I-I'.

FIG. 6 is a top schematic view of an electronic device according to a third embodiment of the disclosure. FIG. 7 is a cross-sectional schematic view of the electronic device of FIG. 6 along a cross-sectional line I-I'. For the sake of clarity and convenience of description, FIG. 6 omits showing several elements in an electronic device 100*b*, and FIG. 7 omits showing several elements in the electronic device 100*b*. Please refer to FIG. 6, FIG. 7, FIG. 1, and FIG. 2E at the same time. The electronic device 100*b* of the embodiment is similar to the electronic device 100 of FIG. 1 and FIG. 2E, but the difference between the two is that the electronic device 100*b* of the embodiment further includes multiple light sensing elements 180, a light emitting unit layer 130*b* further includes a seventh light emitting unit 138 and a reflection layer 139, a circuit layer 120*b* further includes a sixth electrode 1216, and the second semiconductor layer SL2 in the first light emitting unit 131, the second light emitting unit 132, the third light emitting unit 133, the fourth light emitting unit 134, and the seventh light emitting unit 138 is connected to each other. In other words, in the embodiment, each light emitting unit has a part of the second semiconductor layer SL2.

Specifically, please refer to FIG. 6 and FIG. 7 at the same time. The black matrix layer 137 in the light emitting unit layer 130*b* includes an opening 1371. The opening 1371 may expose a part of the second semiconductor layer SL2, the opening 1371 may overlap the spacer 142 of the light guiding layer 140 in the direction Z, and the opening 1371 does not overlap the opening 141 of the light guiding layer 140 in the direction Z.

The stack unit U1 of the seventh light emitting unit 138 is disposed in the opening 1371 of the black matrix layer 137. Since the stack unit U1 of the seventh light emitting unit 138 may overlap the spacer 142 of the light guiding layer 140 in the direction Z, light emitted by the seventh light emitting unit 138 is directed toward the direction of the circuit layer 120*b*. The electrode E1 of the seventh light emitting unit 138 may be electrically connected to the sixth electrode 1216 of the circuit layer 120*b* through the conductive member C1.

In the embodiment, the seventh light emitting unit 138 may be regarded as a light emitting unit for testing. The seventh light emitting unit 138 may receive a passive signal, and the frequency of the passive signal may be lower than frequencies of driving signals of other light emitting units (for example, the first light emitting unit 131, the second light emitting unit 132, the third light emitting unit 133, and the fourth light emitting unit 134).

The reflection layer 139 is disposed on a sidewall of the opening 1371, and the reflection layer 139 can improve the light emitting efficiency through reflecting the light emitted by the seventh light emitting unit 138.

The circuit layer 120*b* further includes a sixth electrode 1216, and the wiring stack 129 may include, but not limited to, a buffer layer 1221, a buffer layer 1222, a gate insulation layer 123, an insulation layer 1241, an insulation layer 1242, a transistor 125, an electrode 126, a flat layer 1271, a wiring layer 128, and a flat layer 1272. The transistor 125 includes a semiconductor SE, a gate GE, a source SD1, and a drain SD2. The buffer layer 1221 is disposed on the substrate 110, the buffer layer 1222 is disposed on the buffer layer 1221, the semiconductor SE is disposed on the buffer layer 1222, the gate insulation layer 123 is disposed on the semiconductor SE, the gate GE is disposed on the gate insulation layer 123, the insulation layer 1241 is disposed on the gate GE, the insulation layer 1242 is disposed on the insulation layer 1241, the source SD1, the drain SD2, and the electrode 126 are respectively disposed on the insulation layer 1242, the flat layer 1271 is disposed on the source SD1 and the drain SD2, the wiring layer 128 is disposed on the flat layer 1271, the flat layer 1272 is disposed on the wiring layer 128, and the first electrode 1211, the second electrode 1212, the third electrode 1213, the fourth electrode 1214, the fifth electrode 1215, and the sixth electrode 1216 are disposed on the flat layer 1272.

The light sensing elements 180 are uniformly disposed on the substrate 110 in an array arrangement, but the disclosure is not limited thereto. The light sensing element 180 is disposed on the electrode 126 of the circuit layer 120*b* and may be surrounded by the flat layer 1271 and the flat layer 1272. The light sensing element 180 may be electrically connected to the electrode 126. In the direction Z, the light sensing element 180 may overlap and correspond to the seventh light emitting unit 138 and the spacer 142 of the light guiding layer 140, and the light sensing element 180 does not overlap the opening 141 of the light guiding layer 140.

The light sensing element 180 may be used to detect the light emitted by the seventh light emitting unit 138 to learn the quality of the seventh light emitting unit 138 and infer the qualities of other light emitting units around the seventh light emitting unit 138. For example, when the light sensing element 180 detects that the seventh light emitting unit 138 is attenuated, it may be inferred that other light emitting units around the seventh light emitting unit 138 may also be attenuated, so the other light emitting units may be further adjusted to ensure the light emitting efficiency.

In the top view (as shown in FIG. 6), the area of the light sensing element 180 may be larger than the area of the seventh light emitting unit 138, and the light sensing element 180 may surround the seventh light emitting unit 138. In the embodiment, the area of the light sensing element 180 may be larger than 1.5 times the area of the seventh light emitting unit 138, so that the light sensing element 180 may have enough area to detect the seventh light emitting unit 138, but not limited thereto.

Figure 8:
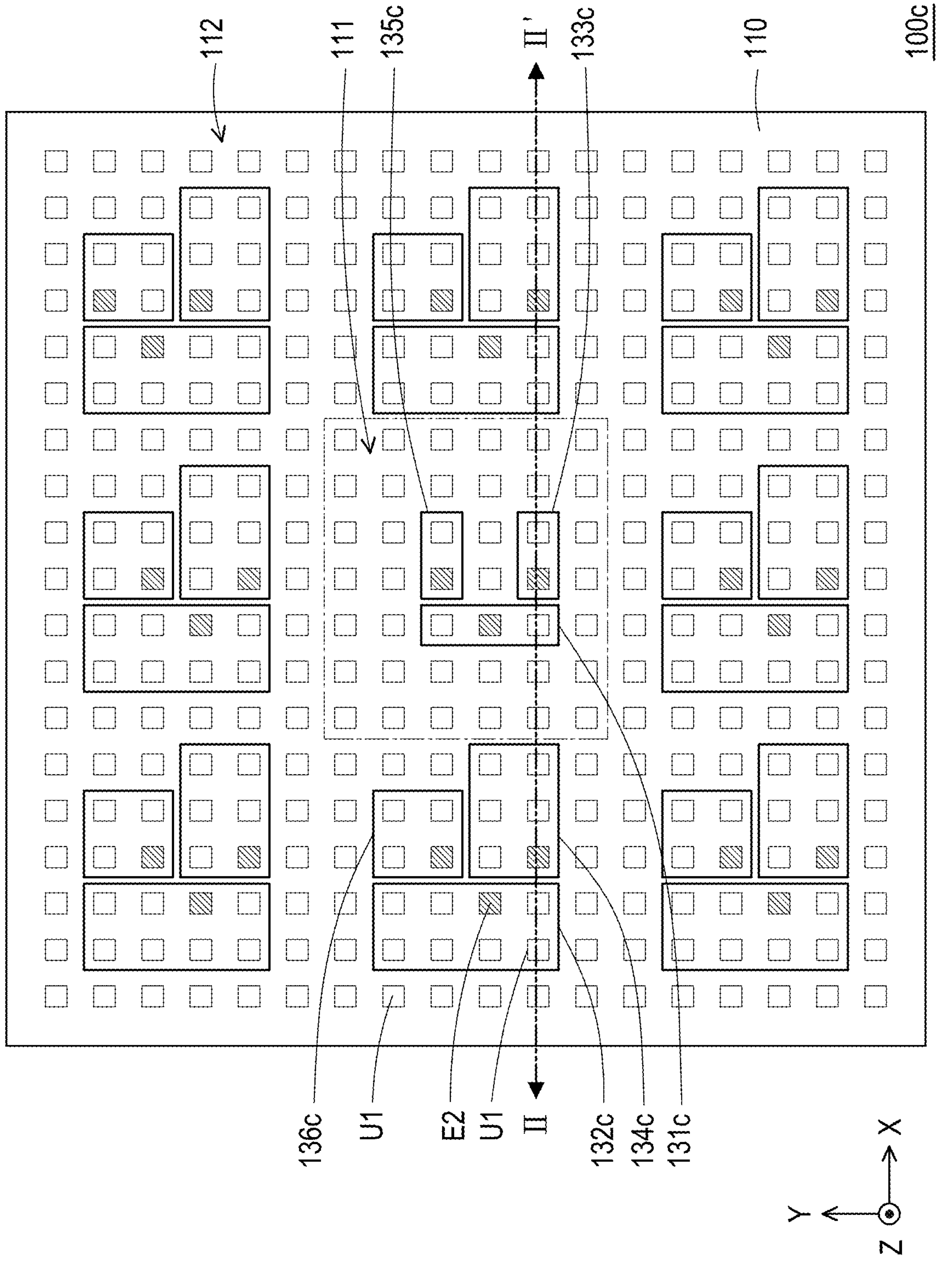
FIG. 8 is a top schematic view of an electronic device according to a fourth embodiment of the disclosure.
Figure 9:
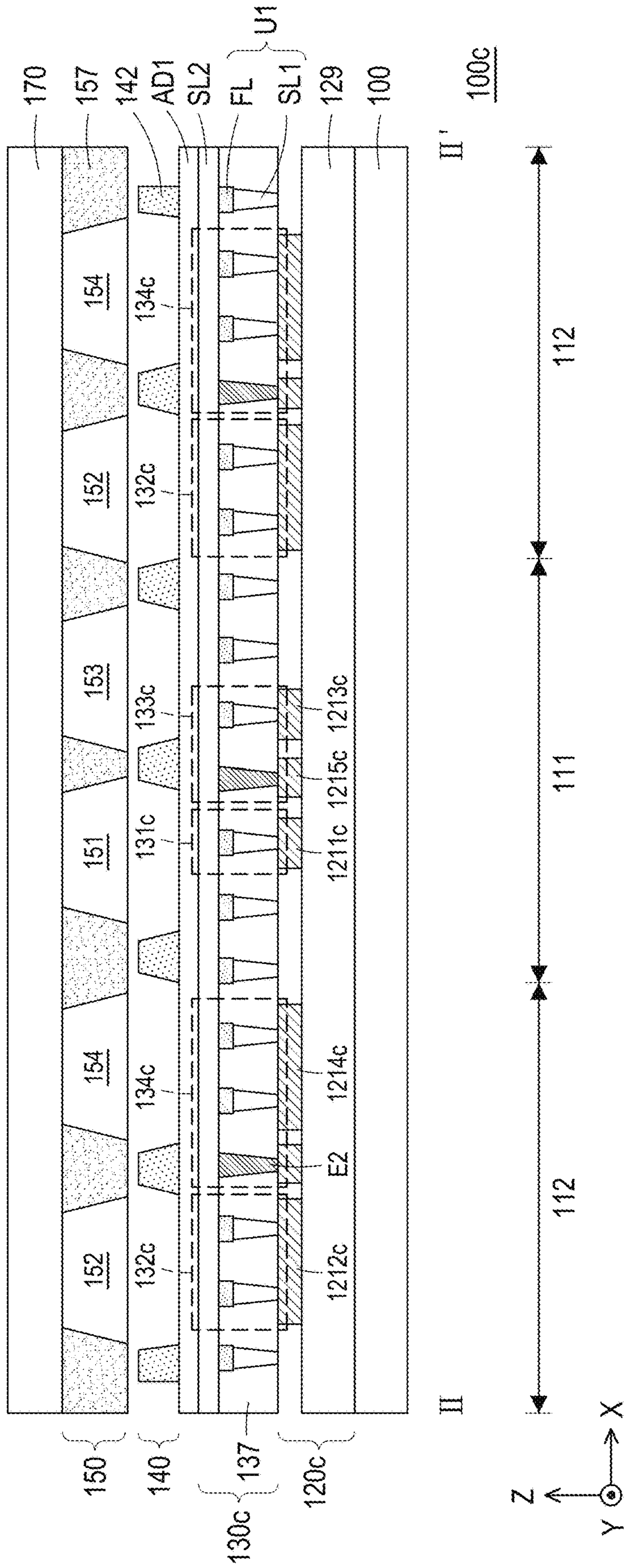
FIG. 9 is a cross-sectional schematic view of the electronic device of FIG. 8 along a cross-sectional line II-II'.

FIG. 8 is a top schematic view of an electronic device according to a fourth embodiment of the disclosure. FIG. 9 is a cross-sectional schematic view of the electronic device of FIG. 8 along a cross-sectional line II-II'. For the sake of clarity and convenience of description, FIG. 8 omits several elements in an electronic device 100*c*. Please refer to FIG. 8, FIG. 9, FIG. 1 and FIG. 2F at the same time. The electronic device 100*c* of the embodiment is similar to the electronic device 100 of FIG. 1 and FIG. 2E, but the difference between the two is that in a light emitting unit layer 130*c* of the electronic device 100*c* of the embodiment, the number of the stack units U1 in different light emitting units is different, and the areas and the widths of the stack units U1 in different light emitting units are the same.

Specifically, please refer to FIG. 8 first. Multiple stack units U1 with the same area are uniformly disposed on the substrate 110 in an array arrangement. In the embodiment, a first light emitting unit 131*c* includes a first number (schematically shown as 2 in FIG. 8) of the stack units U1 and the electrodes E2, a second light emitting unit 132*c* includes a second number (schematically shown as 7 in FIG. 8) of the stack units U1 and the electrodes E2, a third light emitting unit 133*c* includes a third number (schematically shown as 1 in FIG. 8) of the stack unit U1 and the electrode E2, a fourth light emitting unit 134*c* includes a fourth number (schematically shown as 5 in FIG. 8) of the stack units U1 and the electrodes E2, a fifth light emitting unit 135*c* includes a fifth number (schematically shown as 1 in FIG. 8) of the stack unit U1 and the electrode E2, and a sixth light emitting unit 136*c* includes a sixth number (schematically shown as 3 in FIG. 8) of the stack units U1 and the electrodes E2. In the embodiment, the first number may be smaller than the second number, the third number may be smaller than the fourth number, and the fifth number may be smaller than the sixth number, but not limited thereto. In the embodiment, the electrode E2 may be electrically connected to the second semiconductor layer SL2, and the electrode E2 may be regarded as a common cathode or a common anode.

As mentioned above, in the disclosure, the sum of the areas of the stack units U1 included in a light emitting unit in the top view may represent the area of the light emitting unit. Therefore, in the top view (as shown in FIG. 8), the area of the first light emitting unit 131*c* may be smaller than the area of the second light emitting unit 132*c*, the area of the third light emitting unit 133*c* may be smaller than the area of the fourth light emitting unit 134*c*, and the area of the fifth light emitting unit 135*c* may be smaller than the area of the sixth light emitting unit 136*c*. In the top view (as shown in FIG. 1), the area of the third light emitting unit 133*c* is different from the area of the first light emitting unit 131*c*, and the area of the fifth light emitting unit 135*c* is different from the area of the first light emitting unit 131*c*. In other words, in the embodiment, since each light emitting unit includes different numbers of the stack units U1, the light emitting unit including more stack units U1 may have a larger area, and the light emitting unit including less stack units U1 may have a smaller area. For example, since the first light emitting unit 131*c* includes 2 stack units U1 and the second light emitting unit 132*c* includes 7 stack units U1, the area of the first light emitting unit 131*c* is smaller than the area of the second light emitting unit 132*c*.

Generally, during the process of manufacturing light emitting units, the epitaxial effect and the light emitting efficiency of the light emitting units in the central region are higher than those of the light emitting units in the peripheral region due to different positions of forming an epitaxial structure. Therefore, in the electronic device 100*c* of the embodiment, through enabling the number of the stack units U1 included in the light emitting units in the central region 111 (that is, the first light emitting unit 131*c*, the third light emitting unit 133*c*, and the fifth light emitting unit 135*c*) to be smaller than the number of the stack units U1 included in the corresponding light emitting units in the peripheral region 112 (that is, the second light emitting unit 132*c*, the fourth light emitting unit 134*c*, and the sixth light emitting unit 136*c*) (or enabling the area of the light emitting units in the central region 111 to be smaller than the area of the corresponding light emitting units in the peripheral region 112), the light emissions of the light emitting units in the central region 111 may be roughly the same as the light emissions of the light emitting units in the peripheral region 112, thereby improving the display quality.

Please refer to FIG. 9. The second semiconductor layers SL2 corresponding to the stack units U1 may be connected to each other. For example, the second semiconductor layer SL2 in the first light emitting unit 131*c*, the second light emitting unit 132*c*, the third light emitting unit 133*c*, and the fourth light emitting unit 134*c* may be connected to each other. In the embodiment, in the first light emitting unit 131*c* including the first number (schematically shown as 2 in FIG. 8) of the stack units U1, the light emitting material layers FL in at least two stack units U1 may be electrically connected to the same second semiconductor layer SL2.

Please refer to FIG. 9. In the direction Z, in a circuit layer 120*c*, a first electrode 1211*c* may overlap and correspond to the first light emitting unit 131*c*, a second electrode 1212*c* may overlap and correspond to the second light emitting unit 132*c*, a third electrode 1213*c* may overlap and correspond to the third light emitting unit 133*c*, a fourth electrode 1214*c* may overlap and correspond to the fourth light emitting unit 134*c*, and a fifth electrode 1215*c* may overlap and correspond to the electrode E2. The first electrode 1211*c*, the second electrode 1212*c*, the third electrode 1213*c*, and the fourth electrode 1214*c* may be respectively electrically connected to the corresponding numbers of the stack units U1 in the first light emitting unit 131*c*, the second light emitting unit 132*c*, the third light emitting unit 133*c*, and the fourth light emitting unit 134*c*. In the embodiment, since the number of the stack units U1 electrically connected to the first electrode 1211*c* is smaller than the number of the stack units U1 electrically connected to the second electrode 1212*c*, the area of the first electrode 1211*c* may be smaller than the area of the second electrode 1212*c* in the top view. Similarly, the area of the third electrode 1213*c* may also be smaller than the area of the fourth electrode 1214*c* in the top view.

In the embodiment, the stack unit U1 that is not electrically connected to the circuit layer 120*c* may be regarded as a dummy epitaxial structure and cannot emit light.

Figure 10:
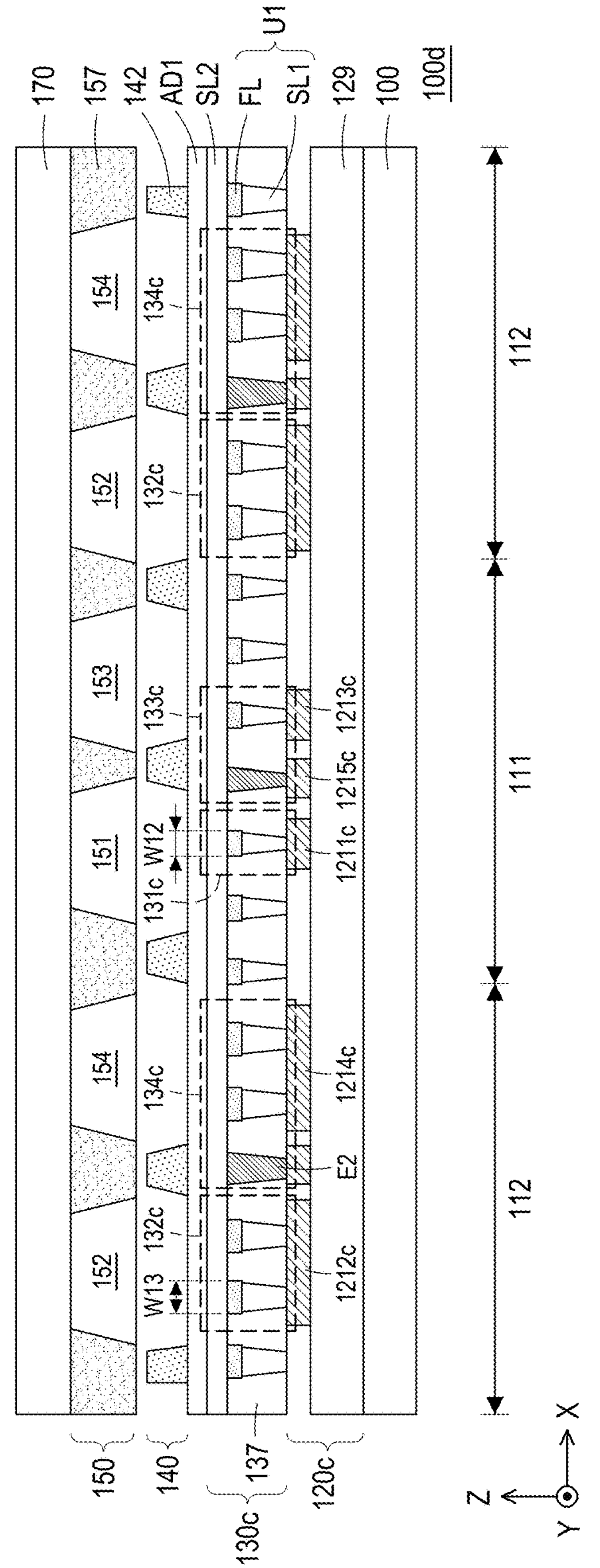
FIG. 10 is a cross-sectional schematic view of an electronic device according to a fifth embodiment of the disclosure.

FIG. 10 is a cross-sectional schematic view of an electronic device according to a fifth embodiment of the disclosure. Please refer to FIG. 10 and FIG. 9 at the same time. An electronic device 100*d* of the embodiment is similar to the electronic device 100*c* of FIG. 9, but the difference between the two is that in the electronic device 100*d* of the embodiment, the width of the stack unit U1 in the central region 111 is different from the width of the stack unit U1 in the peripheral region 112.

Specifically, please refer to FIG. 10. Widths W12 of the stack units U1 in the first light emitting unit 131*c* and the third light emitting unit 133*c* in the central region 111 may be smaller than widths W13 of the stack units U1 in the second light emitting unit 132*c* and the fourth light emitting unit 134*c* in the peripheral region 112. Thus, the light emissions of the light emitting units in the central region 111 may be roughly the same as the light emissions of the light emitting units in the peripheral region 112, thereby improving the display quality.

In the embodiment, the width W12 and the width W13 are respectively the maximum widths of the stack unit U1 in the first light emitting unit 131*c* (or the third light emitting unit 133*c*) and the stack unit U1 in the second light emitting unit 132*c* (or the fourth light emitting unit 134*c*) measured along the direction X.

Figure 11:
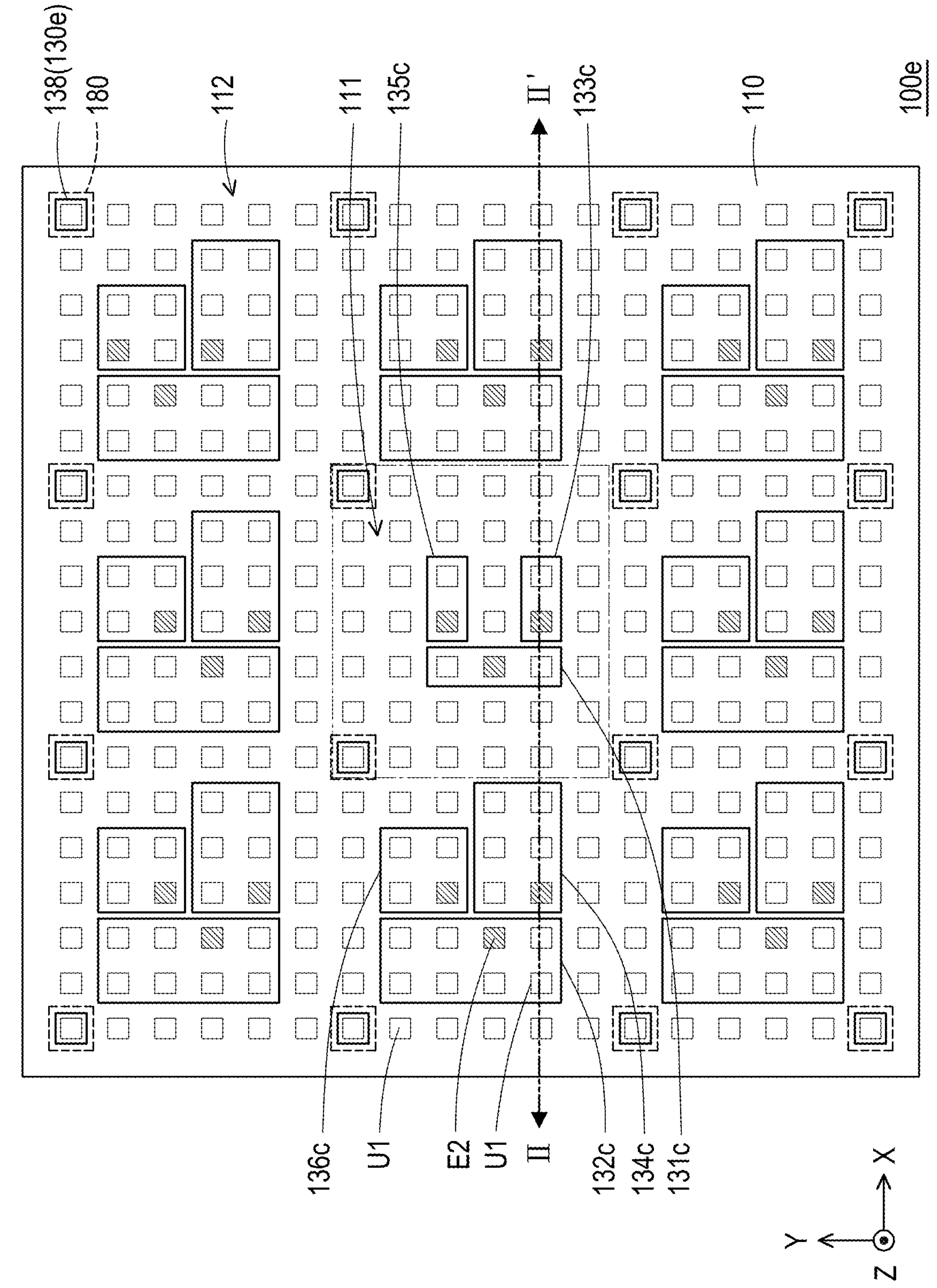
FIG. 11 is a top schematic view of an electronic device according to a sixth embodiment of the disclosure.

FIG. 11 is a top schematic view of an electronic device according to a sixth embodiment of the disclosure. Please refer to FIG. 11 and FIG. 8 at the same time. An electronic device 100*e* of the embodiment is similar to the electronic device 100*c* of FIG. 8, but the difference between the two is that the electronic device 100*e* of the embodiment further includes the light sensing elements 180 as shown in FIG. 6 and FIG. 7, and a light emitting unit layer 130*e* further includes the seventh light emitting unit 138 as shown in FIG. 6 and FIG. 7. The light sensing element 180 may be used to detect the light emitted by the seventh light emitting unit 138 to learn the quality of the seventh light emitting unit 138 and infer the qualities of other light emitting units around the seventh light emitting unit 138.

In summary, in the electronic device according to the embodiments of the disclosure, through enabling the area of the light emitting unit in the central region to be smaller than the area of the corresponding light emitting unit in the peripheral region (or through enabling the number of stack units included in the light emitting unit in the central region to be smaller than the number of stack units included in the light emitting unit in the peripheral region), the light emitting efficiency of the light emitting unit in the central region may be roughly the same as the light emitting efficiency of the light emitting unit in the peripheral region, thereby improving the display quality.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. An electronic device, comprising:
- a substrate;
- a circuit layer, disposed on the substrate;
- a first light emitting unit and a second light emitting unit, disposed on the circuit layer and respectively electrically connected to the circuit layer; and
- a light conversion layer, disposed on the first light emitting unit and the second light emitting unit, and comprising a first light conversion unit overlapping the first light emitting unit and a second light conversion unit overlapping the second light emitting unit;
- wherein the first light conversion unit and the second light conversion unit correspond to a first color,
- wherein in a top view, an area of the first light emitting unit is smaller than an area of the second light emitting unit, and an area of the first light conversion unit is the same as an area of the second light conversion unit.

2. The electronic device according to claim 1, wherein the circuit layer comprises a first electrode corresponding to the first light emitting unit and a second electrode corresponding to the second light emitting unit, and in a top view, an area of the first electrode is smaller than an area of the second electrode.

3. The electronic device according to claim 2, wherein the first light emitting unit comprises a first number of stack units, the second light emitting unit comprises a second number of stack units, and the first number is smaller than the second number.

4. The electronic device according to claim 3, wherein the stack unit comprises a first semiconductor layer and a light emitting material layer, the first semiconductor layer is located between the light emitting material layer and the circuit layer, and the light emitting material layer is electrically connected to the circuit layer through the first semiconductor layer.

5. The electronic device according to claim 4, wherein the first light emitting unit comprises a second semiconductor layer, wherein among the stack units of the first number, the light emitting material layers of at least two stack units are electrically connected to the second semiconductor layer.

6. The electronic device according to claim 3, wherein an area of the stack unit of the first light emitting unit is the same as an area of the stack unit of the second light emitting unit.

7. The electronic device according to claim 1, wherein an area of a stack unit of the first light emitting unit is smaller than an area of a stack unit of the second light emitting unit.

8. The electronic device according to claim 7, wherein a width of the stack unit of the first light emitting unit is smaller than a width of the stack unit of the second light emitting unit.

9. The electronic device according to claim 7, wherein the stack unit comprises a first semiconductor layer and a light emitting material layer, the first semiconductor layer is located between the light emitting material layer and the circuit layer, and the light emitting material layer is electrically connected to the circuit layer through the first semiconductor layer.

10. The electronic device according to claim 1, further comprising:
- a third light emitting unit,
- wherein the light conversion layer comprises a third light conversion unit, the third light conversion unit corresponds to the third light emitting unit and corresponds to a second color, in a top view, an area of the third light emitting unit is different from the area of the first light emitting unit, and an area of the third light conversion unit is different from the area of the first light conversion unit.

11. The electronic device according to claim 10, further comprising:
- a color filter layer, disposed on the light conversion layer and comprising a first filter unit, a second filter unit, and a third filter unit,
- wherein the first light filter unit overlaps the first light conversion unit, the second light filter unit overlaps the second light conversion unit, and the third light filter unit overlaps the third light conversion unit.

12. The electronic device according to claim 11, wherein the first filter unit corresponds to the first color, the third filter unit corresponds to the second color, and in a top view, an area of the third filter unit is different from an area of the first filter unit.

13. The electronic device according to claim 11, wherein an area of the first filter unit is roughly the same as an area of the second filter unit.

14. The electronic device according to claim 10, wherein light emitted by the first light emitting unit and the third light emitting unit corresponds to a third color, and the third color is different from the first color and the second color.

15. The electronic device according to claim 1, further comprising:
- a light guiding layer, disposed between the light conversion layer and the first light emitting unit.

16. The electronic device according to claim 15, wherein the light guiding layer comprises an opening and a spacer, the opening overlaps a stack unit of the first light emitting unit, and a width of a bottom part of the opening is roughly the same as a width of the stack unit.

17. The electronic device according to claim 16, wherein the opening overlaps the first light conversion unit, and a width of a top part of the opening is roughly the same as a width of a surface of the first light conversion unit adjacent to the light guiding layer.

18. The electronic device according to claim 1, wherein a width of a surface of the first light conversion unit away from the light conversion layer is roughly equal to a width of a surface of the second light conversion unit away from the light conversion layer.

19. The electronic device according to claim 1, wherein the first light emitting unit comprises:

a stack unit, comprising a first semiconductor layer and a light emitting material layer, wherein the first semiconductor layer is located between the light emitting material layer and the circuit layer, a second semiconductor layer, disposed on the stack unit; and a buffer layer, disposed under the stack unit and having a rough surface, wherein the light emitting material layer is located between the second semiconductor layer and the first semiconductor layer.

20. The electronic device according to claim 19, wherein the first light emitting unit further comprises:

an electrode, disposed between the stack unit and the circuit layer, and electrically connecting the first semiconductor layer and the circuit layer, wherein the electrode covers the buffer layer.

* * * * *